(12) United States Patent
Chen et al.

(10) Patent No.: US 10,356,903 B1
(45) Date of Patent: Jul. 16, 2019

(54) SYSTEM-IN-PACKAGE INCLUDING OPPOSING CIRCUIT BOARDS

(71) Applicant: Apple Inc., Cupertino, CA (US)

(72) Inventors: Yanfeng Chen, San Ramon, CA (US);
Shankar Pennathur, San Jose, CA (US); Mandar Painaik, Cupertino, CA (US); Lan Hoang, Los Gatos, CA (US); Meng Chi Lee, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/939,097

(22) Filed: Mar. 28, 2018

(51) Int. Cl.
| | |
|---|---|
| *H05K 1/00* | (2006.01) |
| *H05K 1/14* | (2006.01) |
| *H05K 3/00* | (2006.01) |
| *H05K 3/28* | (2006.01) |
| *H05K 1/18* | (2006.01) |
| *H05K 3/46* | (2006.01) |

(52) U.S. Cl.
CPC ............. *H05K 1/144* (2013.01); *H05K 1/181* (2013.01); *H05K 3/0097* (2013.01); *H05K 3/284* (2013.01); *H05K 3/4611* (2013.01)

(58) Field of Classification Search
CPC ... H01H 3/46; H01R 4/02; H01R 4/06; H01R 4/30; H01R 13/05; H01R 13/11; H01R 13/665; H01R 24/22; H02G 3/16
See application file for complete search history.

(56) References Cited

U.S. PATENT DOCUMENTS

| | | | |
|---|---|---|---|
| 9,153,494 B2 | 10/2015 | Choi et al. | |
| 9,245,836 B2 * | 1/2016 | Sadaka | H01L 23/473 |
| 9,601,463 B2 | 3/2017 | Yu et al. | |
| 2013/0081866 A1 * | 4/2013 | Furutani | H05K 1/185 |
| | | | 174/260 |
| 2014/0042604 A1 * | 2/2014 | Jeon | H01L 23/49827 |
| | | | 257/676 |
| 2014/0061866 A1 * | 3/2014 | Lee | H01L 23/481 |
| | | | 257/621 |
| 2015/0287672 A1 * | 10/2015 | Yazdani | H01L 23/49827 |
| | | | 257/414 |
| 2016/0086930 A1 | 3/2016 | Koey et al. | |

* cited by examiner

*Primary Examiner* — Pete T Lee
(74) *Attorney, Agent, or Firm* — Jeffery Watson Mendonsa & Hamilton LLP

(57) ABSTRACT

System-in-package structures and methods of assembly are described. In an embodiment, a system-in-package includes opposing circuit boards, each including mounted components overlapping the mounted components of the opposing circuit board. A gap between the opposing circuit boards may be filled with a molding material, that additionally encapsulates the overlapping mounted components. In some embodiments, the opposing circuit boards are stacked on one another using one or more interposers that may provide mechanical or electrical connection.

20 Claims, 11 Drawing Sheets

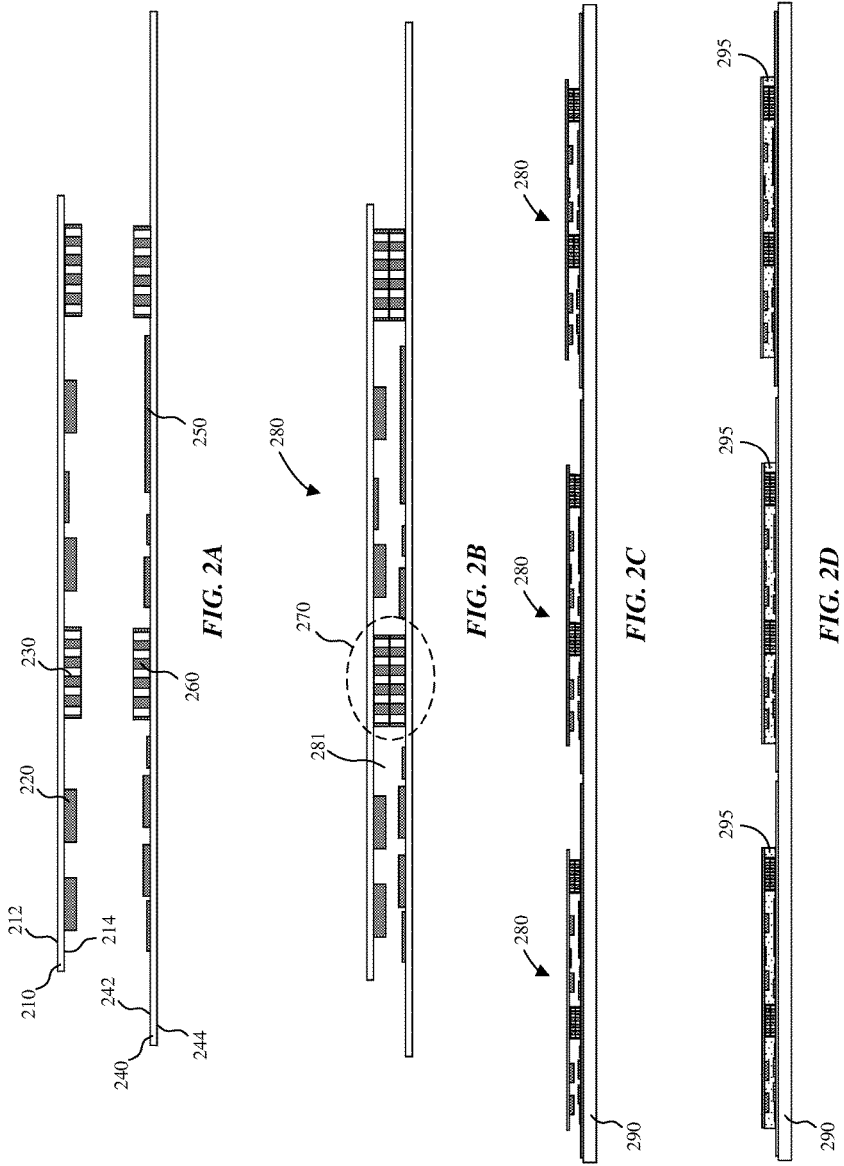

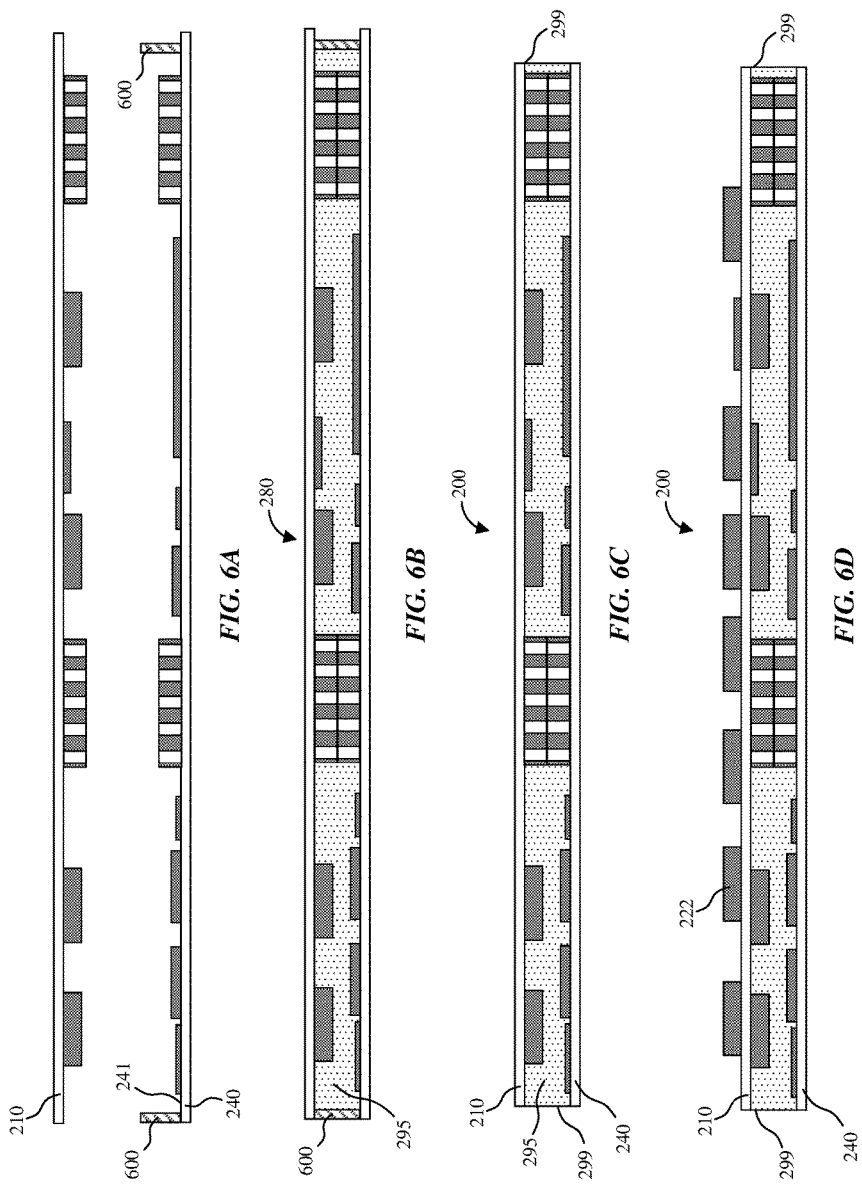

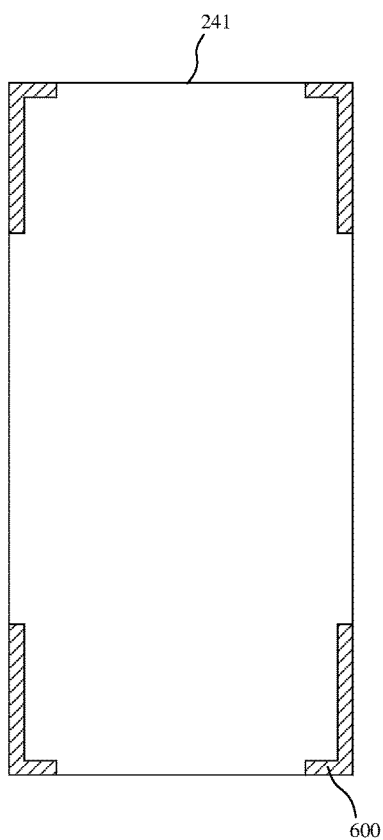
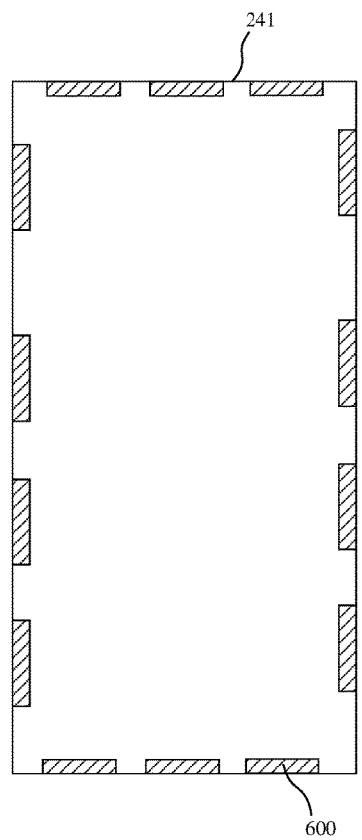
*FIG. 7A*  *FIG. 7B*

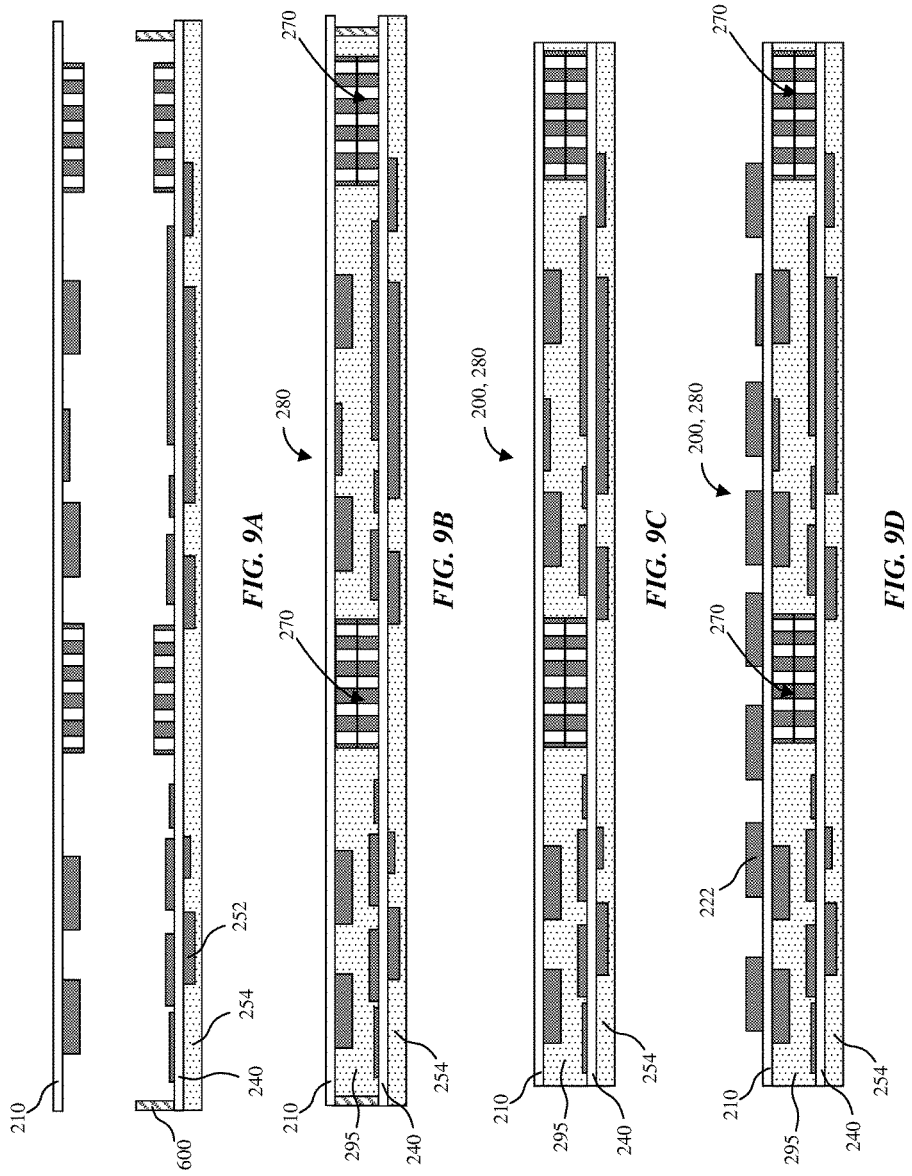

SYSTEM-IN-PACKAGE INCLUDING OPPOSING CIRCUIT BOARDS

BACKGROUND

Field

Embodiments described herein relate to electronic packaging, and more particularly to printed circuit board assembly.

Background Information

The trend in consumer electronics is to make products smaller, with the exception of display size, for a range of product categories including phones, computers, portable music players, earbuds, audio systems, etc. Hence there is a drive for minimization for all the parts inside these products.

The main logic board (MLB) is a common part in almost all of the consumer electronics. Industry has been working to utilize smaller and thinner dies, packages and components. The spacings between the components are also made smaller and smaller. Industry is also trying to add more and more smart functions in all the portable electronics including smart phones, watches, etc. These new functions require new hardware. To accomplish hardware like camera module, alerts, charging, batteries, biosensors, etc. the MLBs may become constrained to certain volume with restrictions on areas, heights, or shapes.

SUMMARY

System-in-package structures and methods of assembly are described. In an embodiment, a system-in-package structure includes a first circuit board having a first side and a second side opposite the first side, one or more second side components mounted on at least the second side of the first circuit board, a second circuit board having a first side and a second side opposite the first side, and one or more first side components are mounted on at least the first side of the second circuit board. In accordance with embodiments, the first side of the second circuit board faces the second side of the first circuit board, and a gap between the first circuit board and the second circuit board is filled with molding material.

The opposing circuit boards may be stacked using one or more interposers, which may provide mechanical and optionally electrical connection. In an embodiment, the interposers include one or more lateral tunnels extending from a laterally exterior side to a laterally interior side of the interposer.

Assembly of the system-in-package in accordance with embodiments may include stacking the first circuit board on the second circuit board, and then molding to stacked circuit boards to fill the gap between the circuit boards with a molding material. In some embodiments, the molding material flows through the one or more lateral tunnels extending through the one or more interposers. The molding material may remain in the lateral tunnels in the final system-in-package structure.

BRIEF DESCRIPTION OF THE DRAWINGS

FIGS. 2A-2E are cross-sectional side view illustrations of a sequence of assembling a system-in-package in accordance with an embodiment.

FIGS. 6A-6D are cross-sectional side view illustrations of a sequence of assembling a system-in-package using sacrificial supports in accordance with an embodiment.

FIGS. 7A-7B are schematic top layout views of sacrificial supports mounted on a circuit board in accordance with embodiments.

FIGS. 9A-9D are cross-sectional side view illustrations of a sequence of assembling a system-in-package with a pre-molded circuit board in accordance with an embodiment.

DETAILED DESCRIPTION

Figure 1:
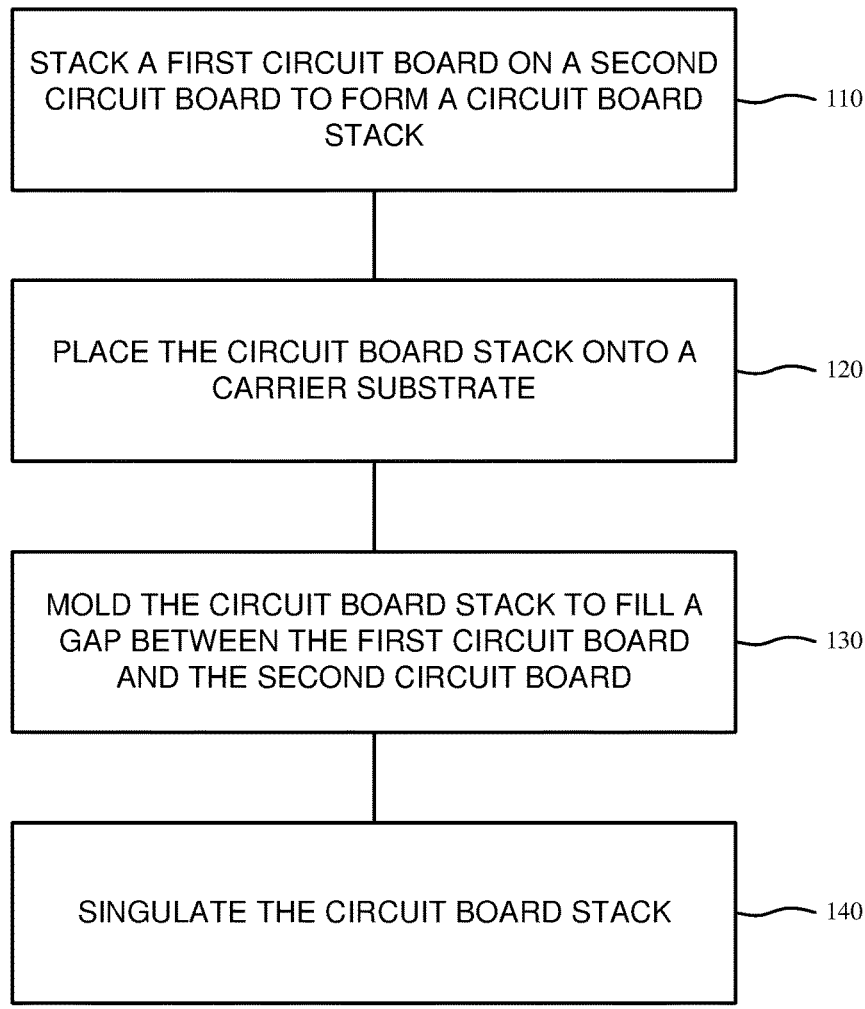
FIG. 1 is a flow chart illustrating a method of assembling a system-in-package in accordance with an embodiment.

Embodiments describe system-in-package (SiP) structures and methods of assembly in which opposing circuit boards are stacked on top of one another, with a gap between the stacked boards being filled with a molding material. In addition, interposer structures can be arranged between the circuit boards to provide mechanical support to the stacked structure, as well as electrical interconnection between the circuit boards. Embodiments described herein may be applicable to a variety of circuit boards, such as printed circuit boards and MLBs.

In one aspect, it has been observed that due to open face designs of traditional circuit board arrangements, such as with main logic boards (MLBs), there can be increasing yield losses, reliability failures, and performance degradations as component density increases. Industry has commonly looked to underfill materials to make the whole circuit boards more robust. Though underfill materials and tools can be expensive. In accordance with embodiments, alternative structures and processes are described which may achieve target reliability and performance function.

In accordance with embodiments, two circuit boards are stacked together as opposed to using a single open faced board. As a result, the overall x, y size for the system may be smaller. The two circuit boards may be connected with interposers. There can be interposers on both sides (e.g. stacked and bonded), or one single interposer on one of the boards. In accordance with embodiments, the interposers electrically connect the two circuit boards, and physically connect the two circuit boards. For example, the interposers include vias for signal and power transmission between the circuit boards. A molding design with a molding material, such as an epoxy molding compound (EMC), can additionally be included to fill the gap between the two circuit boards. For example, a film assisted transfer molding process may be able to fill gaps of several tens of microns. In some embodiments, this may allow for the elimination of underfilling the board components. The molded design may also be mechanically robust, particularly compared to open face designs or hollow board stacks. Additionally, the molded structure may be water proof. Furthermore, due to stacked design, component layout on the circuit boards may be more flexible for improved signal integrity.

The interposers in accordance with embodiments, may include through vias, for signal and power connections, and optionally include active or passive components such as integrated circuits, resistors, capacitors (e.g. electrostatic discharge (ESD) decoupling capacitors), etc. The interposers may additionally provide electromagnetic interference (EMI) shielding. In some embodiments, the interposers are arranged along the edge, or outline of the circuit boards. In some embodiments, the interposers include lateral tunnels, or spaces to assist with the molding operation. These lateral tunnels may be partially or completely filled with the molding compound used to fill the gap between opposing circuit boards.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", "between", "spanning" and "on" as used herein may refer to a relative position of one layer with respect to other layers. One layer "over", "spanning" or "on" another layer or bonded "to" or in "contact" with another layer may be directly in contact with the other layer or may have one or more intervening layers. One layer "between" layers may be directly in contact with the layers or may have one or more intervening layers.

Referring now to FIG. 1 a cross-sectional side view illustration is provided of a method of assembling a system-in-package in accordance with an embodiment. In interest of clarity and conciseness, the following discussion of FIG. 1 is made concurrently with the description of the sequence illustrated in FIG. 2A-2E. It is to be appreciated however, that embodiments are not so limited, and variations of structure and sequence are contemplated. For example, various structural and sequence variations are provided in FIGS. 3-10C that follow.

In accordance with embodiments, the illustrated processing sequences begin with circuit boards that have been populated with components, and optionally interposers, with SMT assembly. This may have been done at the panel level, followed by singulation of the populated circuit boards. In certain variations, the circuit boards can be populated on a single side or both sides, or also molded on a single side or both side, or not yet molded. Thus, the processing sequences described herein in accordance with embodiments may be compatible with a variety of different circuit board designs. These circuit boards may then be stacked and molded, which can be performed at a re-constituted panel process, followed by singulation of stacked circuit boards. A final SMT assembly may be optionally be performed, before or after singulation, to add any additional desired components to the stacked circuit boards.

In an embodiment, at operation 110 a first circuit board 210 is stacked on a second circuit board 240 to form a circuit board stack 280. As shown in FIGS. 2A-2B, the first circuit board 210 may include a first side 212 and a second side 214 opposite the first side, and one or more second side components 220 mounted on at least the second side 214 (e.g. bottom side) of the first circuit board 210. The second circuit board 240 may include a first side 242 and a second side 244 and one or more first side components 250 mounted on at least the first side 212 (e.g. top side) of the second circuit board 240. In accordance with embodiments, a gap 281 exists between the first circuit board 210 and the second circuit board 240, as well as the associated components as shown in FIG. 2B. Thus, the gap 281 is also between the components 220, 250 that overlap each other (e.g vertically, as opposed to laterally).

Figure 2E:
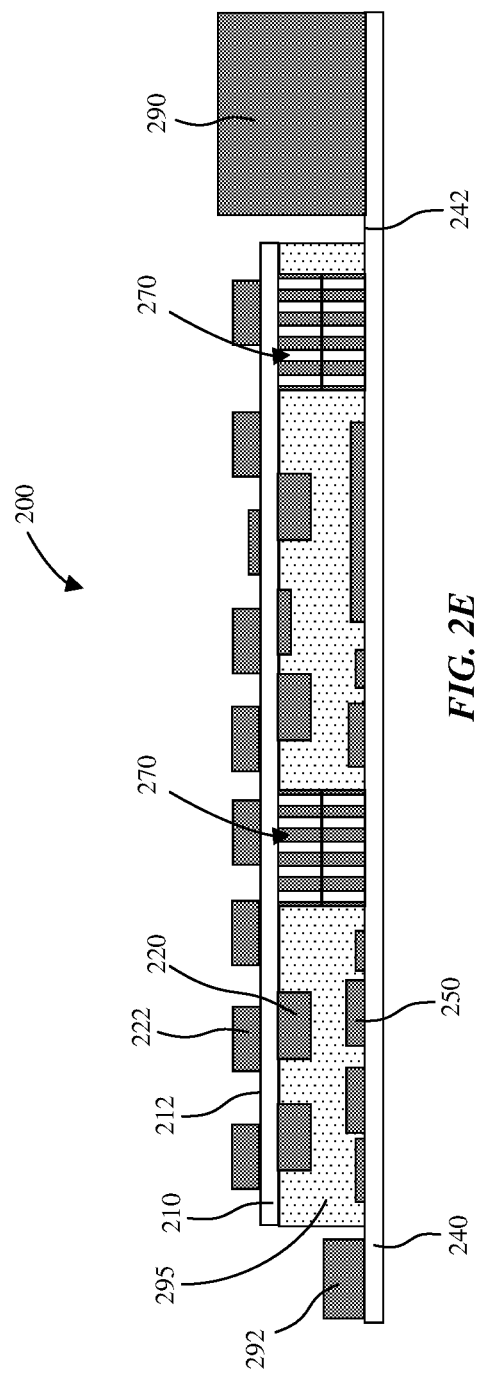
Figure 3:
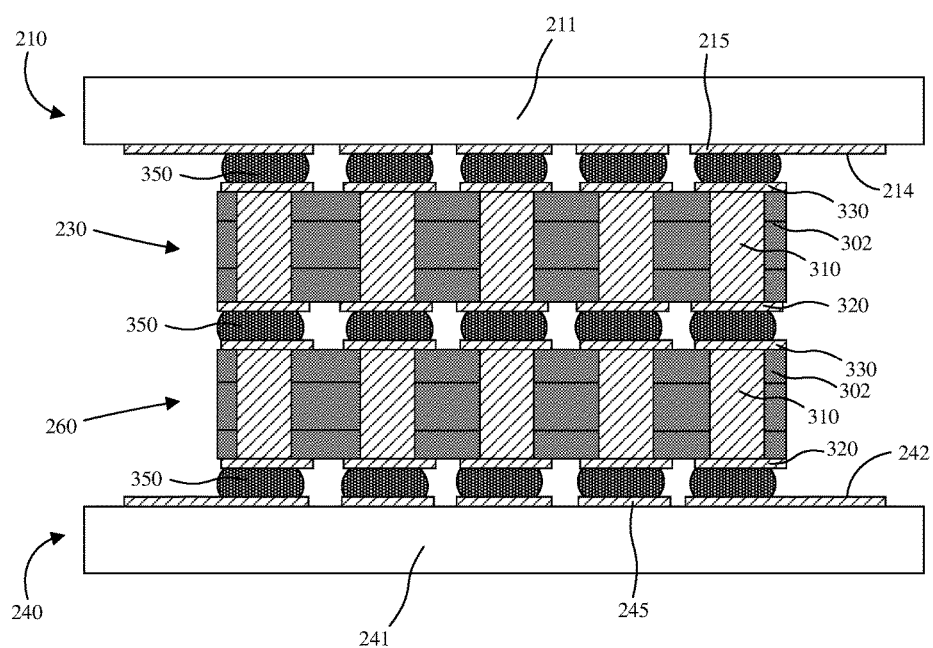
FIG. 3 is a schematic cross-sectional side view illustration of stacked interposers mounted between two circuit boards in accordance with an embodiment.

As shown in FIG. 2B and the close up illustration in FIG. 3, interposers 230, 260 can also be mounted on either or both of the circuit boards 210, 240 and extend between and connect the first circuit board 210 and the second circuit board 240. The connection may be physical, and may additionally be an electrical connection between the circuit boards. Thus, there may be a single interposer mounted on one of the circuit boards 210, 240 that connects the circuit boards 210, 240 after stacking. Alternatively, as illustrated, there may be an interposer mounted on each circuit board, and stacking the circuit boards includes stacking the interposers 230, 260 to form an interposer stack 270. The one or more interposers 230, 260 in accordance with embodiments are located laterally adjacent the one or more components 220, 250 on their respective circuit boards 210, 240.

The circuit boards 210, 240 can be substrates with one more layers of conductive traces or routing inside them. For example, the circuit boards 210, 240 may include a rigid substrate 211, 241 with conductive traces 215, 245 for attachment of various components, interposers, etc. Conductive traces 215, 245 may be contained wholly or partially within the rigid substrates 211, 241, and may also be formed on surfaces of the substrates 211, 241. In some configurations, a substantial portion of the conductive traces 215, 245 are contained within multiple metal layers in the substrates 211, 241, with limited routing of the conductive traces 215, 245 on top of the substrates 211, 241. In an embodiment, each interposer 230, 260 is bonded to a conductive trace 215, 245 on a substrate 211, 241 of a respective circuit board 210, 240. The substrates 211, 241 may be formed of a variety of materials, including traditional substrates such as FR-2 (a phenolic paper impregnated with resin), FR-4 (a woven fiberglass impregnate with resin), ABF (Ajinomoto Build-up Film) metal or metal core substrates, silicon core substrates, ceramics, polymers, etc. In some embodiments, the substrates may be flexible. Conductive traces 215, 245 may be formed of suitable materials, such as copper, etc. In an embodiment, the first conductive traces 215 additionally electrically connect the one or more second side components 220 mounted on the second side 214 of the first circuit board 210, and the second conductive traces 245 additionally electrically connect the one or more first side components 250 mounted on the first side 242 of the second circuit board 240.

Still referring to FIG. 3, the one or more components 220, 250 and one or more interposers 230, 260 may be mounted on their corresponding circuit boards using SMT techniques such as flip chip, with solder bumps 350. Alternative techniques may additionally be used, including conductive films, pins, wire bonding, etc. In the embodiment illustrated, the stacked interposers 230, 260 are bonded to one another. In application where the interposers 230, 260 provide primarily structural support, any suitable bonding technique may be used. Where the interposers 230, 260 additionally provide electrical connection, the bonding technique may support the electrical connections. For example, conductive pastes, films, and solder bumps 350 may be suitable bonding methods. In order to facilitate electrical connections the interposers 230, 260 may include one or more metal traces 310, such as vias, extending from a bottom side to a top side of the interposers. The metal traces 310 may be contained within one or more layers of insulating material(s) 302. Thus, interposers 230, 260 are not limited to configurations with through vias, and metal traces 310 may be formed in multiple metal layers and layers of insulating material 302. The interposers 230, 260 may optionally include top side routing 330 or bottom side routing 320 to facilitate electrical connections.

Referring now to FIG. 2C, at operation 120 the circuit board stack 280 can be placed onto a carrier substrate 290. This may be performed at the panel level, where a plurality of circuit board stacks 280 are placed on the carrier substrate 290. A variety of carrier substrates maybe suitable such as glass or metal carriers. Placement may be aided by the addition of an adhesive tape layer. The carrier substrate 290 may be a rigid substrate to support handling, and subsequent molding and singulation operations.

The circuit board stack(s) 280 may then may be molded at operation 130 to fill the gap 281 between the first circuit board 210 and the second circuit board 240 with a molding material 295. As shown in FIG. 2D, the molding operation may be performed at the panel level, with a plurality of molding cavities corresponding to the plurality of circuit board stacks 280. In an embodiment, the molding operation is a film assisted transfer molding process. Such a process may be capable of filling gaps of several tens of microns. In one aspect, this may allow for the omission of underfill materials for any of the components 220, 250 or interposers 230, 260. The circuit board stack may then be singulated at operation 140. Singulating in accordance with embodiments may cut through only one of the circuit boards (e.g. second circuit board 240), or through both circuit boards 210, 240 and the molding material 295 in the gap 281.

In accordance with embodiments, additional processing and SMT mounting of various components can be performed before or after singulation. FIG. 2E is a schematic cross-sectional side view illustration of a singulated system-in-package 200 in accordance with an embodiment. As shown in the singulated structure the components 220 overlap components 250. Additionally, the gap between the circuit boards 210, 240 and additionally between the components 220, 250 is filled with the molding material 295. In accordance with embodiments, the first circuit board 210 includes a plurality of interposers 230 laterally adjacent to the one or more components 220 on the first circuit board, and the second circuit board 240 includes a plurality of interposers 260 laterally adjacent to the one or more components 250 on the second circuit board, and stacking the first circuit board on the second circuit board includes bonding the first plurality of interposers to the second plurality of interposers to form interposer stacks 270.

In accordance with embodiments, the final surface mount operation can optionally place components 222 on the first side 212 of the first circuit board 210, and/or place components 290, 292 on the first side 242 of the second circuit board 240. As shown, second circuit board 240 may have more area (e.g. increased length or width) than the first circuit board 210 to accommodate additional components 290, 292. In other embodiments, the sequence of final surface mount of components and singulation may be reversed.

Figure 4:
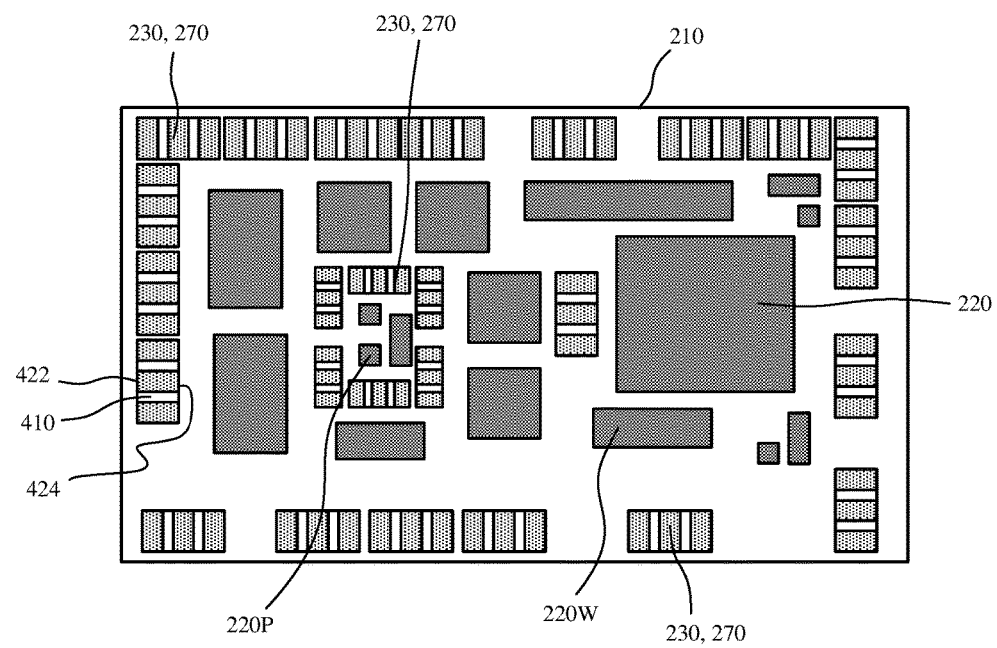
FIG. 4 is a schematic top layout view of circuit board components and interposers on a circuit board in accordance with embodiments.
Figure 5A:
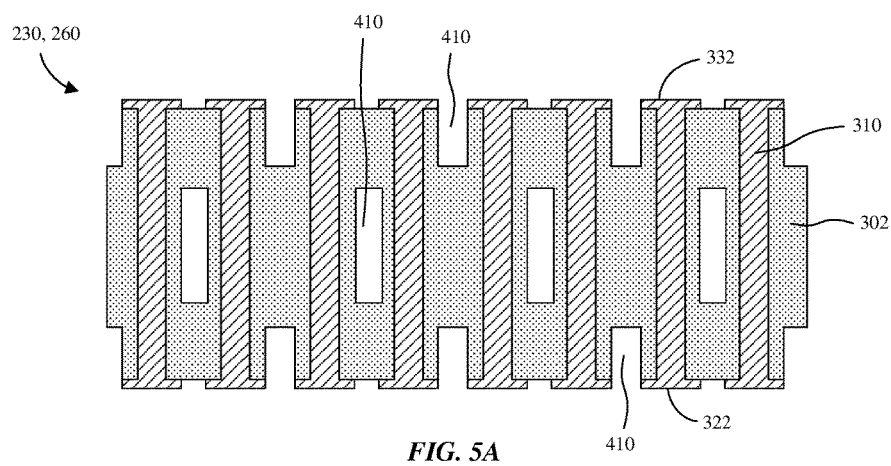
FIGS. 5A-5B are schematic cross-sectional side view illustrations of interposers including lateral tunnels in accordance with embodiments.
Figure 5B:
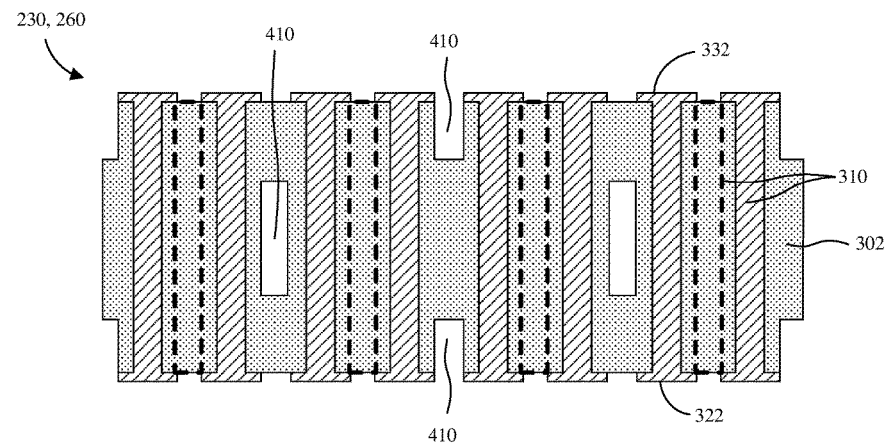

Referring now to both and FIG. 4 and FIGS. 5A-5B, FIG. 4 is a schematic top layout view of circuit board components and interposers in a system-in-package in accordance with embodiments, and FIGS. 5A-5B are schematic cross-sectional side view illustrations of interposers including lateral tunnels 410 in accordance with embodiments. In interest of clarity, the schematic top layout view of FIG. 4 is made with regard to the components 220 and interposers 230 relative to a single circuit board 210 within the circuit board stack.

The interposers in accordance with embodiments have already been described as providing mechanical support between the stacked circuit boards and electrical connection between the circuit boards. In accordance with embodiments, the interposers may also be utilized to provide shielding, such as electromechanical interference (EMI) shielding. Thus, the interposers may be arranged in a variety of different ways. In some embodiments, the interposers are dispersed to provide mechanical support or electrical connections at specified locations. The interposers may be spaced apart, or closely together. When utilized for EMI shielding the interposers may be arranged closely together, and may surround one or more components. As shown in FIG. 4, a plurality of the interposers 230/270 may be arranged laterally around one or more of the components 220 (as well as components 250) in a configuration where the interposers 230/270 are arranged adjacent a periphery of one of the circuit boards 210 (or 240). This may be a uniform configuration entirely around the periphery of the circuit board(s), or a non-uniform arrangement where denser spacing is placed nearer specific components, and wider spacing may be allowed nearer other components. In another embodiment also illustrated in FIG. 4, a plurality of the interposers 230/270 may be arranged in a smaller scale, and among the components 220, yet surround one or more specific components 220. In both examples, the interposers 230/270 may surround, or be more densely arranged (spacing between), a subsystem of specific passive components 220P in order to shield them from other components, such as wireless components 220W outside the subsystem within the stacked system-in-package, or outside the system-in-package.

In some embodiments, while a dense arrangement of interposers may be provided, this may potentially affect flow of the molding compound during the molding operation. Thus, the interposers 230, 260 may include lateral tunnels 410 that extend from a laterally exterior side 422 of the interposer to a laterally interior side 424 of the interposer, through which the molding compound can flow during molding.

In an embodiment, molding the circuit board stack 280 includes flowing a molding compound through lateral tunnels 410 of a plurality of interposers 230 and/or 260 connecting the bottom side of the first circuit board 210 to the top side of the second circuit board 240, where the plurality of interposers 230 and/or 260 are laterally adjacent to the one or more components 220 on the first circuit board 210 and the one or more components 250 on the second circuit board 240.

Referring now to FIGS. 5A-5B, various configurations are illustrated for providing lateral tunnels 410. It is understood that these configurations are exemplary, and embodiments envision alternative arrangements. As shown, the interposers 230, 260 may include a top side 332, a bottom side 322, and a plurality of metal traces 310 extending from the bottom side 322 to the top side 332 of the interposer. One or more lateral tunnels 410 may extend from a laterally exterior side 422 to a laterally interior side 424 of the interposer. Additionally, the interposer may optionally include a top side routing layer 330 and a bottom side routing layer 320 (as shown in FIG. 3). In some embodiments, a metallic shielding layer may be formed on exterior the exterior side 422 of the interposer, particularly for EMI shielding application. In some embodiments, the interposers 230, 260 can include additional active or passive components, such as an integrated circuit, resistor, capacitor (e.g. electrostatic discharge decoupling capacitor), etc. embedded in the interposer.

Both of the particular embodiments illustrated in FIGS. 5A-5B provide one or more lateral tunnels 410 extending through the top side 332 of the interposer. For example, these may resemble notches formed in the insulating material(s) 302. Similarly, one or more lateral tunnels 410 (e.g. notches) may extend through the bottom side 322 of the interposer. In addition, or alternatively, one or more intermediate lateral tunnels 410 can extend through a center section of the interposer. Such intermediate lateral tunnels 410 are fully enclosed (e.g. are not open at the top or bottom sides). FIG. 5A in particular is illustrative of an example of an interposer including columns of metal traces 310 (e.g. vias). In the embodiment illustrated in FIG. 5B, the interposer may include multiple, staggered columns of metal traces 310. In such an embodiment, the number of lateral tunnels 410 may be reduced, or spacing increased to accommodate additional columns of metal traces 310.

The interposers in accordance with embodiments may remain between the circuit boards in the system-in-package structure. The lateral tunnels 410 may provide a pathway for molding compound flow during the molding operation. In accordance with some embodiments, the lateral tunnels 410 may remain fully filled with the molding material 295 in the final structure.

In the following description of FIGS. 6A-10C several process flow variations are provided. While illustrated and described separately, it is understood that many of these several process flows can be combined together, as well as with the description related to FIGS. 1-5B.

FIGS. 6A-6D are cross-sectional side view illustrations of a sequence of assembling a system-in-package using sacrificial supports in accordance with an embodiment. FIGS. 7A-7B are schematic top layout views of sacrificial supports mounted on a circuit board in accordance with embodiments. It is envisioned that mold flash onto a non-molded side of a circuit board is possible during a film assisted molding operation of the circuit board stacks. In an embodiment, sacrificial supports 600 may be utilized to mitigate this potential. In such an embodiment, both circuit boards 210, 240 can optionally be cut to slightly larger than end-product size. The sacrificial supports 600 may then be mounted in the enlarged portion of the one or both of the circuit boards, for example, around the perimeter. The supports can be mounted on selective areas of the circuit boards, such as at all corners, as illustrated in FIG. 7A. The sacrificial supports 600 may also be a frame with enough holes for mold flow, as illustrated in FIG. 7B.

The the sacrificial supports 600 may allow the circuit board stack 280 to be stronger during the molding operation, with less resulting deformation of the circuit board stack 280. Additionally, this may allow for pressure on the circuit boards to be increased, and mold flash or bleed avoided. In the process sequence illustrated in FIG. 6A, the sacrificial supports may be mounted on one or both of the circuit boards. Circuit board 240 is selected for illustrational purposes. The circuit boards are then stacked and molded, as shown in FIG. 6B. Following the molding operation, the stacked circuit boards can be singulated as shown in FIG. 6C to remove the sacrificial supports 600, followed by an optional final surface mount of components 222 as shown in FIG. 6D. Alternatively, the order of the final surface mount of components 222 and singulation can be reversed. In some embodiments, the singulation operation may create singulated edges 299 spanning sides of the first circuit board 210, sides of the second circuit board 240, and sides of the molding compound 295.

Figure 8A:
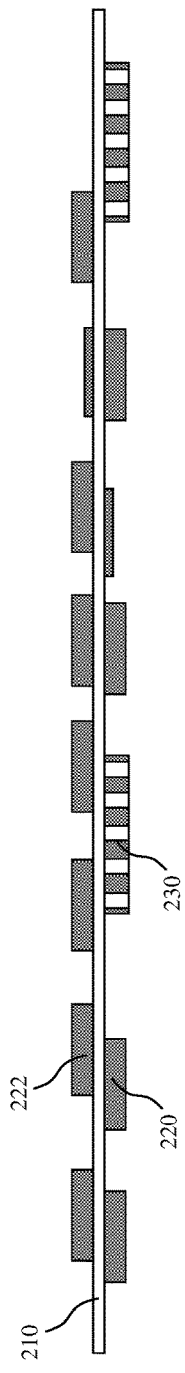
FIGS. 8A-8C are cross-sectional side view illustrations of a sequence of assembling a system-in-package with double side surface mounted circuit boards in accordance with an embodiment.
Figure 8B:
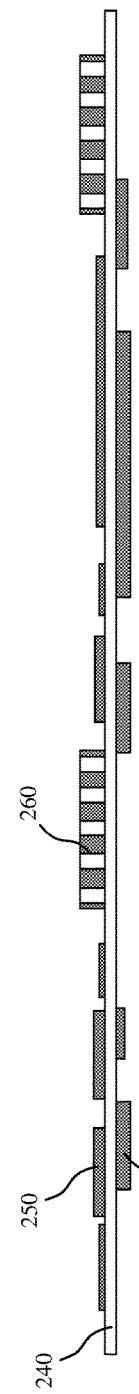
Figure 8C:
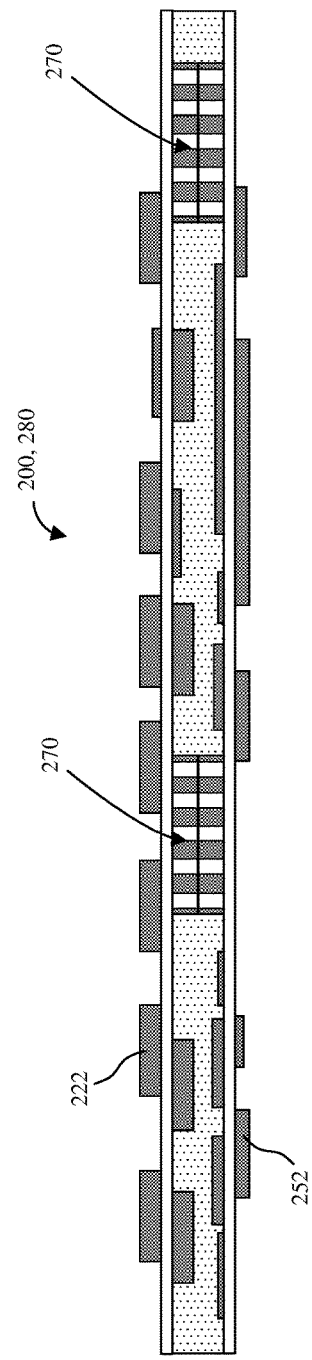

FIGS. 8A-8C are cross-sectional side view illustrations of a sequence of assembling a system-in-package with double side surface mounted circuit boards in accordance with an embodiment. While embodiments described and illustrated thus far have focused on stacking of single side mounted circuit boards 210, 240, embodiments are not so limited. Thus, the SMT processes on either or both circuit boards 210, 240 may be done before stacking, or molding. As shown, the first circuit board 210 may include components 220, 222 mounted on opposite sides, and the second circuit board 240 may include components 250, 252 mounted on opposite sides. The double side mounted circuit boards may then be stacked and molded, as illustrated in FIG. 8C.

FIGS. 9A-9D are cross-sectional side view illustrations of a sequence of assembling a system-in-package with a premolded circuit board in accordance with an embodiment. In the process variation illustrated in FIGS. 9A-9D, one of the circuit boards (second circuit board 240) already includes molded components 252 on the second side 244, and encapsulated in molding material 254. SMT mounting for both circuit boards illustrated in FIG. 9A can be performed at the panel level, and singulated to unit circuit boards 210, 240 before stacking at FIG. 9B. Additionally, the sequence of final SMT mounting of components 222 in FIG. 9D and singulation in FIG. 9C can be switched as previously described.

Figure 10A:
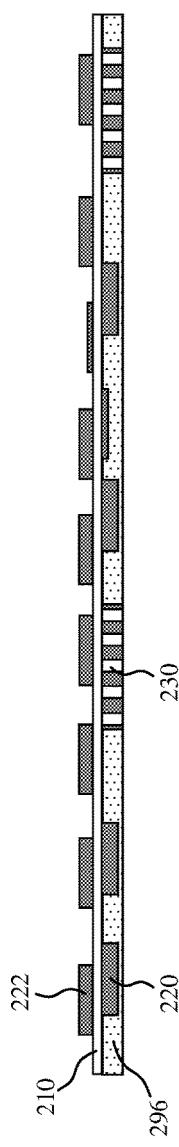
FIGS. 10A-10C are cross-sectional side view illustrations of a sequence of assembling a system-in-package with pre-molded circuit boards in accordance with an embodiment.
Figure 10B:
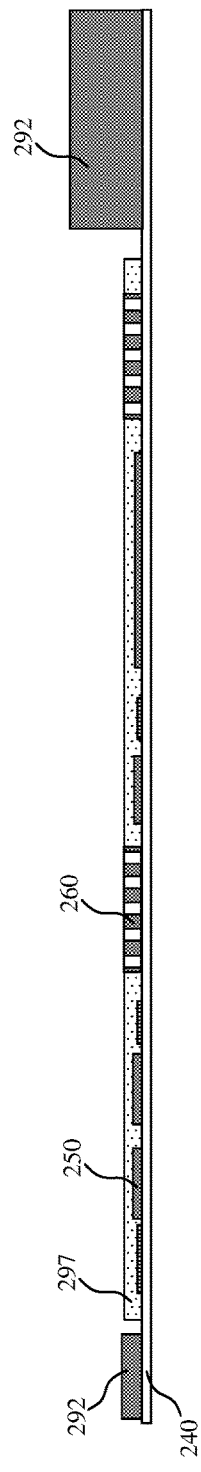
Figure 10C:
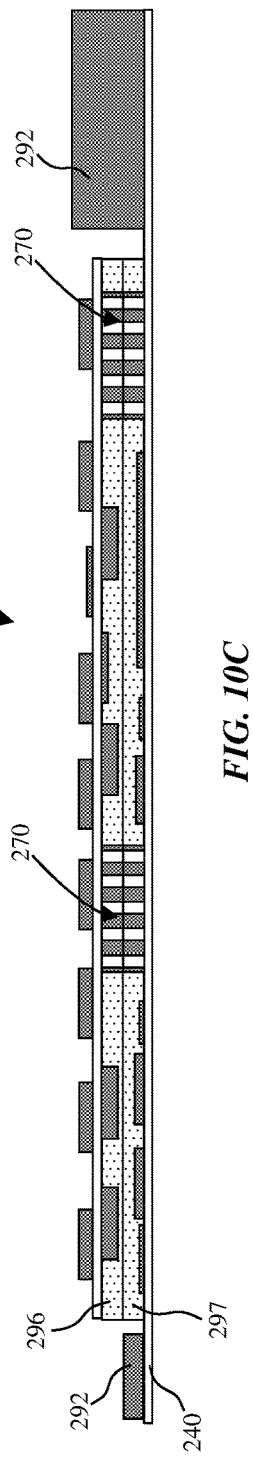

FIGS. 10A-10C are cross-sectional side view illustrations of a sequence of assembling a system-in-package with pre-molded circuit boards in accordance with an embodiment. The process flow of FIGS. 10A-10C includes a process variation in that both SMT component mounting and molding operations are performed for both circuit boards 210, 240 prior to stacking. As shown in FIG. 10A-10B, a molding operation such as film assisted molding is done with surfaces of the interposers 230, 260 remaining exposed for electrical connection. A final stacking operation is performed as shown in FIG. 10C to create the circuit board stack 280. During the final stacking operation, an adhesive layer such as epoxy glue or thermal sensitive adhesive may be used between circuit boards 210, 240 to enhance mechanical rigidity and hold the molding materials 296, 297 together. Interposers 230, 260 may be bonded using suitable methods as previously described, such as conductive pastes, films, and solder bumps 350.

In utilizing the various aspects of the embodiments, it would become apparent to one skilled in the art that combinations or variations of the above embodiments are possible for forming a system in package including stacked circuit boards. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A system-in-package comprising:
   a first circuit board having a first side and a second side opposite the first side;
   one or more second side components mounted on at least the second side of the first circuit board;
   a second circuit board having a first side and a second side opposite the first side, wherein the first side of the second circuit board faces the second side of the first circuit board, and wherein one or more first side components are mounted on at least the first side of the second circuit board; and
   a gap between the first circuit board and the second circuit board, wherein the gap is filled with molding material;
   one or more interposers extending between and electrically connecting the first circuit board to the second circuit board, wherein the one or more interposers are laterally adjacent the one or more second side components and the one or more first side components;
   wherein at least one interposer of the one or more interposers includes one or more lateral tunnels extending from a laterally exterior side to a laterally interior side of the interposer; and
   wherein the molding material laterally surrounds the one or more first and second side components and the one or more interposers, and at least partially fills the one or more lateral tunnels for the at least one interposer.

2. The system-in-package of claim 1, further comprising singulated edges spanning sides of the first circuit board, sides of the second circuit board, and sides of the molding material.

3. The system-in-package of claim 1, wherein:
   the first circuit board comprises a first rigid substrate and first conductive traces that electrically connect the one or more second side components mounted on at least the second side of the first circuit board; and
   the second circuit board comprises a second rigid substrate and second conductive traces that electrically connect the one or more first side components mounted on at least the first side of the second circuit board.

4. The system-in-package of claim 3, wherein the one or more second side components overlap the one or more first side components.

5. The system-in-package of claim 3, wherein the one or more interposers is a plurality of interposers extending between and connecting the first circuit board to the second circuit board, wherein the plurality of interposers are laterally adjacent the one or more second side components and the one or more first side components.

6. The system-in-package of claim 5, wherein the plurality of interposers are arranged laterally around the one or more second side components and the one or more first side components adjacent a periphery of at least one of the first and second circuit boards.

7. The system-in-package of claim 5, wherein the plurality of interposers are arranged laterally around a plurality of the one or more second side components.

8. The system-in-package of claim 3, wherein each of the one or more interposers comprises an insulating material, and a plurality of metal traces extending from a bottom side to a top side of the interposer.

9. The system-in-package of claim 8, wherein each of the one or more interposers includes one or more lateral tunnels extending from a laterally exterior side to a laterally interior side of interposer.

10. The system-in-package of claim 9, wherein the one or more lateral tunnels for each of the one or more interposers are fully filled with the molding material.

11. The system-in-package of claim 8, wherein the one or more interposers are solder bonded to the first and second circuit boards.

12. The system-in-package of claim 8, wherein the at least or more interposers extending between and electrically connecting the first circuit board to the second circuit board, comprises a first group of interposers bonded to the first circuit board and a second group of interposers bonded to the second circuit board, wherein the first and second groups of interposers are bonded to each other.

13. The system-in-package of claim 12, wherein the first and second groups of interposers are bonded to each other with a plurality of solder bumps.

14. An interposer comprising:
   a top side;
   a bottom side;
   a plurality of metal traces extending from the bottom side to the top side of the interposer; and
   one or more lateral tunnels extending from a laterally exterior side to a laterally interior side of the interposer;
   wherein the one or more lateral tunnels comprises one or more first lateral tunnels extending through a top side or a bottom side of the interposer, and one or more intermediate lateral tunnels extending through a center section of the interposer, wherein the one or more first lateral tunnels are not connected to the one or more intermediate lateral tunnels.

15. The interposer of claim 14, further comprising a top side routing layer and a bottom side routing layer.

16. The interposer of claim 14, further comprising a metallic shielding layer on an exterior side of the interposer.

17. The interposer of claim 14, further comprising an active or passive component embedded in the interposer.

18. The interposer of claim 14, wherein the one or more first lateral tunnels comprises one or more top side lateral tunnels extending through a top side of the interposer, and one or more bottom side lateral tunnels extending through a bottom section of the interposer.

19. A system-in-package formed by a method of assembly, comprising:
   stacking a first circuit board on a second circuit board to form a circuit board stack, wherein the first circuit board includes one or more components and a first plurality of interposers mounted on a bottom side of the first circuit board, and the second circuit board comprises one or more components and a second plurality of interposers mounted on a top side of the second circuit board;
   wherein stacking the first circuit board on the second circuit board comprises bonding the first plurality of interposers to the second plurality of interposers such that the first circuit board is electrically connected to the second circuit board with the bonded first and second pluralities of interposers, wherein at least one interposer of the first and second plurality of interposers includes one or more lateral tunnels extending from a laterally exterior side to a laterally interior side of the interposer;

placing the circuit board stack onto a carrier substrate;

molding the circuit board stack to fill a gap between the first circuit board and the second circuit board with a molding material, wherein molding the circuit board stack comprises flowing the molding material through lateral tunnels of the at least one interposer of the first and second plurality of interposers, wherein the molding material laterally surrounds the one or more first and second side components and the one or more interposers, and at least partially fills the one or more lateral tunnels for the at least one interposer; and singulating the circuit board stack.

20. The system-in-package of claim 19, wherein singulating the circuit board stack comprises cutting through the first circuit board, the second circuit board, and the molding material in the gap between the first circuit board and the second circuit board.

\* \* \* \* \*